(12) United States Patent
Iskanius et al.

(10) Patent No.: US 9,801,307 B2
(45) Date of Patent: Oct. 24, 2017

(54) CAPACITOR MODULE FOR A MOBILE WORKING MACHINE

(71) Applicant: Visedo Oy, Lappeenranta (FI)

(72) Inventors: Matti Iskanius, Lappeenranta (FI); Tero Jarvelainen, Lappeenranta (FI); Mikko Piispanen, Lappeenranta (FI)

(73) Assignee: VISEDO OY, Lappeenranta (FI)

( * ) Notice: Subject to any disclaimer, the term of this patent is extended or adjusted under 35 U.S.C. 154(b) by 262 days.

(21) Appl. No.: 14/832,178

(22) Filed: Aug. 21, 2015

(65) Prior Publication Data
US 2016/0066475 A1 Mar. 3, 2016

(30) Foreign Application Priority Data

Aug. 26, 2014 (EP) .................................... 14182266

(51) Int. Cl.
| | | |
|---|---|---|
| *B60L 1/00* | (2006.01) | |
| *H05K 7/20* | (2006.01) | |
| *B60L 11/00* | (2006.01) | |
| *H01G 9/00* | (2006.01) | |
| *H01G 11/12* | (2013.01) | |

(Continued)

(52) U.S. Cl.
CPC .......... *H05K 7/20409* (2013.01); *B60K 6/28* (2013.01); *B60L 11/005* (2013.01); *H01G 2/02* (2013.01); *H01G 2/08* (2013.01); *H01G 4/228* (2013.01); *H01G 4/38* (2013.01); *H01G 9/0003* (2013.01); *H01G 11/12* (2013.01); *H01G 11/74* (2013.01); *H01G 11/78* (2013.01); *B60Y 2200/92* (2013.01); *B60Y 2306/05* (2013.01); *Y02E 60/13* (2013.01); *Y02T 10/7022* (2013.01); *Y10S 903/907* (2013.01)

(58) Field of Classification Search
CPC ........ H01L 2924/00; H01L 2924/0002; H02M 7/003; C08L 67/03
See application file for complete search history.

(56) References Cited

U.S. PATENT DOCUMENTS

2002/0011363 A1* 1/2002 Shirakawa ............ H02M 7/003
                                                                        180/65.22
2009/0080126 A1    3/2009 Wilk et al.
(Continued)

FOREIGN PATENT DOCUMENTS

EP            2 660 395 A1    11/2013

OTHER PUBLICATIONS

EP Search Report, dated Feb. 6, 2015, from corresponding EP application.

*Primary Examiner* — Sibin Chen
(74) *Attorney, Agent, or Firm* — Young & Thompson

(57) ABSTRACT

A capacitor module includes at least one capacitor element (101) and a cooling structure (103) for cooling the capacitor element. The electrical terminals (102*a*, 102*b*) of the capacitor element are mechanically connected to the cooling structure to be in heat-conductive relations with the cooling structure so that at least one of the electrical terminals of the capacitor element is mechanically connected to the cooling structure via a flexible connection element (104*a*, 104*b*) made of electrically conductive material. The flexible connection element allows the corresponding electrical terminal to move with respect to the cooling structure when the distance (D) between the electrical terminals is changing because of changes in load and/or temperature, and/or because of ageing.

19 Claims, 4 Drawing Sheets

(51) Int. Cl.
*H01G 2/08* (2006.01)
*B60K 6/28* (2007.10)
*H01G 11/74* (2013.01)
*H01G 11/78* (2013.01)
*H01G 4/38* (2006.01)
*H01G 2/02* (2006.01)
*H01G 4/228* (2006.01)

(56) References Cited

U.S. PATENT DOCUMENTS

2011/0007480 A1* 1/2011 Souda ................ B60K 6/28
 361/728
2014/0160822 A1 6/2014 Kuwano et al.
2014/0218043 A1 8/2014 Tsuchiya

* cited by examiner

CAPACITOR MODULE FOR A MOBILE WORKING MACHINE

FIELD OF THE INVENTION

The invention relates to a capacitor module suitable for being a basic construction unit of a capacitive energy-storage. Furthermore, the invention relates to a mobile working machine comprising an electromechanical power transmission chain.

BACKGROUND

An electromechanical power transmission chain comprises typically one or more electrical machines and an electronic power converter. The electromechanical power transmission chain can be a series transmission chain where one of the electrical machines operates as generator and the electronic power converter is arranged to convert the electrical voltages produced by the generator into electrical voltages having amplitudes and frequencies suitable for the one or more other electrical machines. The generator can be driven with a combustion engine that can be e.g. a diesel engine, an Otto-cycle engine, or a turbine engine. The other electrical machines can be, for example, electrical motors in wheels of a mobile working machine. The electronic power converter comprises typically an intermediate circuit, a converter stage between the generator and the intermediate circuit and one or more other converter stages between the intermediate circuit and the other electrical machines. It is also possible that the electromechanical power transmission chain is a parallel transmission chain where the generator is occasionally used as a motor that assists the combustion engine, especially when high output power is needed. In this case, the electronic power converter comprises typically an intermediate circuit, a converter stage between the generator and the intermediate circuit, and one or more converter stages between the intermediate circuit and one or more energy-storages.

The above-mentioned intermediate circuit is typically a capacitive energy-storage that comprises one or more capacitor modules each comprising one or more capacitor elements and a cooling structure for cooling the one or more capacitor elements. The cooling structure typically comprises one or more heat-sink elements provided with cooling fins for conducting heat to the ambient air and/or with cooling channels for conducting cooling fluid, e.g. water. Each capacitor element comprises an electrode structure for storing electrical energy in the form of electric charge polarization between the electrodes of the electrode structure. The electrode structure is connected to electrical terminals of the capacitor element, and the electrode structure is located inside a casing which can be made of for example aluminum. In many cases, the casing is fitted to an aperture of a heat-sink element.

A cooling arrangement of the kind described above is, however, not free from challenges. One of the challenges is related to a need to arrange a sufficiently good thermal contact between the casing and the heat-sink element. Another challenge is that a significant portion of the heat generation takes place in the electrode structure which carries electrical currents, and therefore the thermal conductivity of the heat transfer path from the electrode structure to the casing can be critical. It is also challenging to connect the electrical terminals of a capacitor element to the cooling structure so as to provide a more direct heat conductive relation between the electrode structure and the cooling structure because the distance between the electrical terminals may vary due to changes in load and/or temperature and/or due to ageing of the capacitor element. Because of changes in the distance between the electrical terminals, a part of the cooling structure connected to one of the electrical terminals should be flexibly supported with respect to another part of the cooling structure connected to the other of the electrical terminals. This, in turn, might be problematic in a shaking environment which is the case in conjunction with e.g. a mobile working machine.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new capacitor module that is suitable for being a basic construction unit of a capacitive energy-storage. A capacitor module according to the invention comprises:

capacitor elements each comprising electrical terminals, a cooling structure for cooling the capacitor elements, the electrical terminals of the capacitor elements being mechanically connected to the cooling structure to be in heat-conductive relations with the cooling structure, flexible connection elements made of electrically conductive material, at least one of the electrical terminals of each of the capacitor elements being mechanically connected to the cooling structure via one of the flexible connection elements, an electrically insulating membrane between the cooling structure and one or more of the flexible connection elements, one or more connection plates made of electrically conductive material and arranged to provide galvanic connections between the capacitor elements so that one ends of the flexible connection elements are pressed between the connection plates and the electrically insulating membrane, and one or more insulator plates comprising electrically insulating material, and pressing devices for pressing the insulator plates towards the cooling structure so that the connection plates are pressed between the insulator plates and the ends of the flexible connection elements.

As mentioned above, at least one of the electrical terminals of each capacitor element is mechanically connected to the cooling structure via one of the flexible connection elements. Thus, the electrical terminal under consideration is allowed to move with respect to the cooling structure when the distance between the electrical terminals of the capacitor element under consideration is changing. Therefore, there is no need for flexibly supported parts of the cooling structure because the required flexibility lies in the mechanical connection between the electrical termina) and the cooling structure.

In accordance with the invention, there is provided also a new mobile working machine. A mobile working machine according to the invention comprises:

a combustion engine, and an electromechanical power transmission chain between the combustion engine and one or more wheels, chain tracks, and/or other actuators of the mobile working machine.

The electromechanical transmission chain comprises a capacitive energy-storage comprising one or more capacitor modules according to the invention.

The mobile working machine comprises preferably, but not necessarily, a liquid cooling system configured to cool both a hydraulic system of the mobile working machine and the electromechanical power transmission chain. The mobile working machine can be, for example, a tractor, a bucket charger, a road drag, a bulldozer, or any other working machine having wheels and/or chain tracks or any other means for moving.

A number of exemplifying and non-limiting embodiments of the invention are described in accompanied dependent claims.

Various exemplifying and non-limiting embodiments of the invention both as to constructions and to methods of operation, together with additional objects and advantages thereof, will be best understood from the following description of specific exemplifying and non-limiting embodiments when read in connection with the accompanying drawings.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE FIGURES

Exemplifying and non-limiting embodiments of the invention and their advantages are explained in greater detail below in the sense of examples and with reference to the accompanying drawings, in which.

DESCRIPTION OF THE EXEMPLIFYING EMBODIMENTS

Figure 1A:
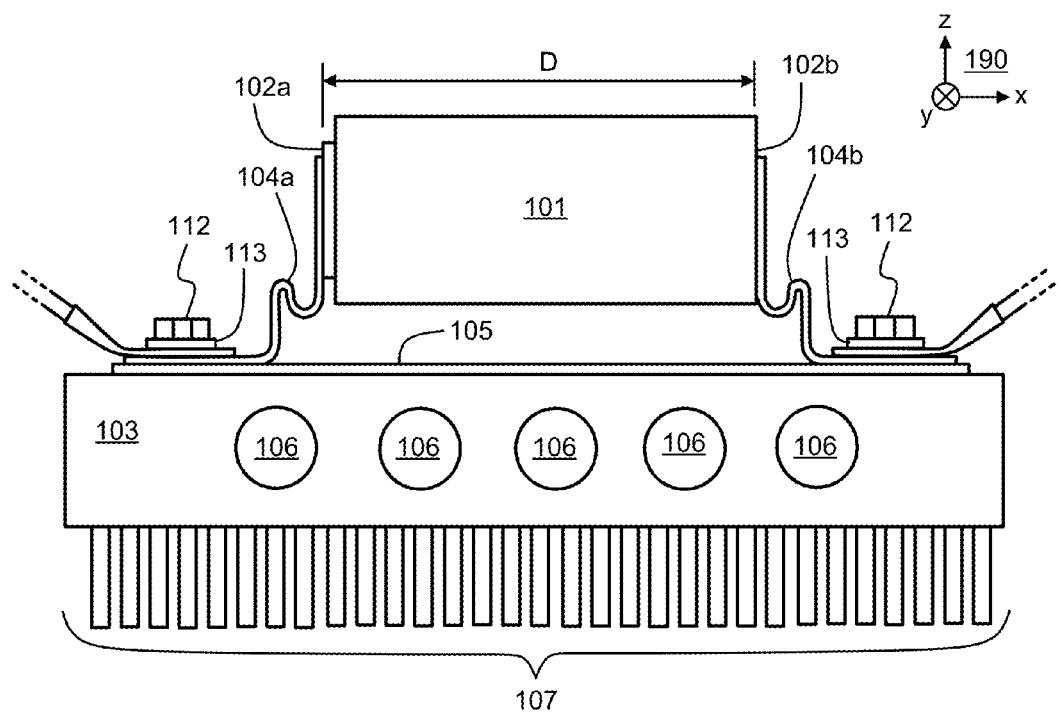
FIGS. 1a and 1b illustrate a capacitor module according to the prior art.
Figure 1B:
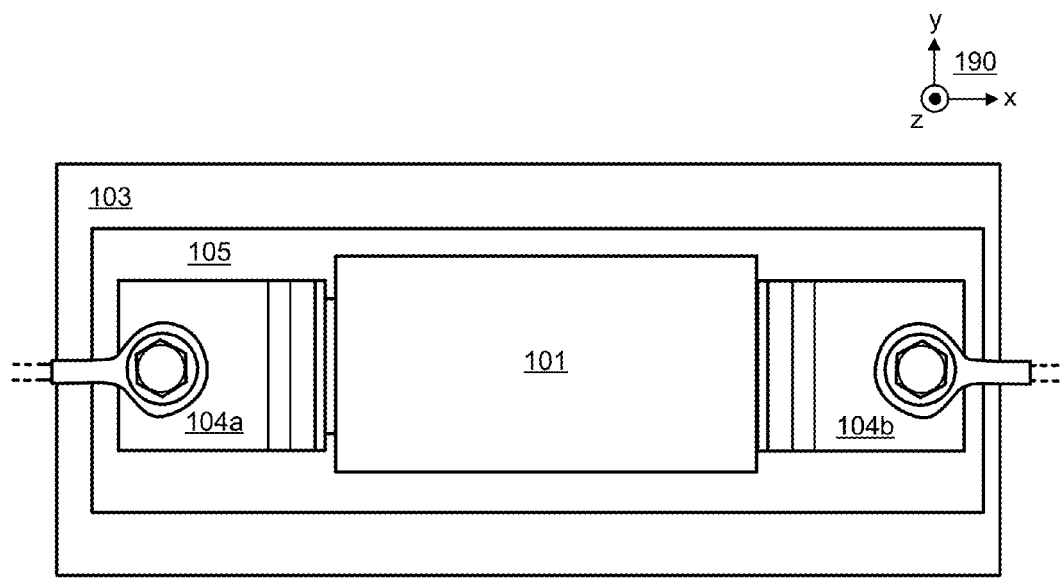

As a prelude to the description of exemplifying embodiments of the invention, FIG. 1a shows a side view of a capacitor module according to the prior art. FIG. 1b shows a top view of the capacitor module. The viewing directions related to FIGS. 1a and 1b are illustrated with the aid of a coordinate system 190. The capacitor module comprises a capacitor element 101 for storing electrical energy. The capacitor element comprises an electrode structure for storing the electrical energy in the form of electric charge polarization between electrodes of the electrode structure. The electrode structure may comprise e.g. a first foil, a second foil, and dry dielectric material between the first and second foils. It is also possible that the electrode structure comprises an anode foil, a cathode foil, and porous filler material between the anode and cathode foils so that the filler material is impregnated with liquid electrolyte. In this case, the capacitor element 101 is an electrolytic capacitor. Furthermore, it is also possible that the electrode structure constitutes an electric double-layer capacitor "EDLC" which is often called a "super capacitor". Furthermore, the capacitor element 101 comprises a casing made of e.g. aluminum and electrical terminals 102a and 102b connected to the electrodes of the electrode structure. In many cases, the casing constitutes one of the electrical terminals.

The capacitor module comprises a cooling structure 103 for cooling the capacitor element 101. The cooling structure may comprise for example cooling fins for conducting heat to the ambient air and/or cooling channels for conducting liquid or gaseous cooling fluid. Liquid cooling fluid can be e.g. water, and gaseous cooling fluid can be e.g. air. In the exemplifying case illustrated in FIG. 1a, the cooling structure 103 comprises both the cooling channels 106 and the cooling fins 107. The capacitor module comprises flexible connection elements 104a and 104b made of electrically conductive material. As illustrated in FIG. 1a, the electrical terminals 102a and 102b of the capacitor element 101 are mechanically connected to the cooling structure 103 via the flexible connection elements 104a and 104b. Thus, the electrical terminals 102a and 102b are allowed to move with respect to the cooling structure 103 when the distance D between the electrical terminals is changing due to changes in load and/or temperature and/or due to ageing of the capacitor element 101.

In the exemplifying capacitor module illustrated in FIGS. 1a and 1b, each of the flexible connection elements 104a and 104b is a curved sheet of electrically conductive material, e.g. copper or aluminum. A first end of each flexible connection element has a galvanic contact with the corresponding electrical terminal, a second end of the flexible connection element is mechanically connected to the cooling structure, and the middle portion of the flexible connection element is arranged to bend in response to a situation in which the corresponding electrical terminal moves with respect to the cooling structure. In this exemplifying case, the flexible connection elements 104a and 104b provide not only the thermally conductive paths from the electrical terminals 102a and 102b to the cooling structure 103 but also a mechanical support for the capacitor element 101. It is, however, also possible that each flexible connection element is e.g. a plexus of thin copper filaments and there are other means for providing the mechanical support for the capacitor element.

In the exemplifying capacitor module illustrated in FIGS. 1a and 1b, there is an electrically insulating membrane 105 between the cooling structure 103 and the flexible connection elements 104a and 104b so as to provide a galvanic separation between the cooling structure and the flexible connection elements. The flexible connection elements 104a and 104b are pressed against the membrane 105 with the aid of bolts 112 which are insulated from the flexible connection elements 104a and 104b with the aid of electrically insulating washers 113 and bushes. The electrically insulating bushes are not shown in FIGS. 1a and 1b. The electrically insulating membrane 105 can be for example Sil-Pad® 400, Sil-Pad® K-10, or Gap Pad® 1450 produced by the Bergquist Company, or some other suitable material or composite which provides a sufficiently good thermal conductivity and a sufficiently good barrier against dielectric breakthrough. It is also possible that, the cooling structure comprises two separate heat-sink elements and one or both of the heat-sink elements may have a galvanic connection to the respective electrical terminal of the capacitor element via the respective flexible connection element, and thus the heat-sink element under consideration may have a same electrical potential as the respective electrical terminal of the capacitor element.

Figure 2A:
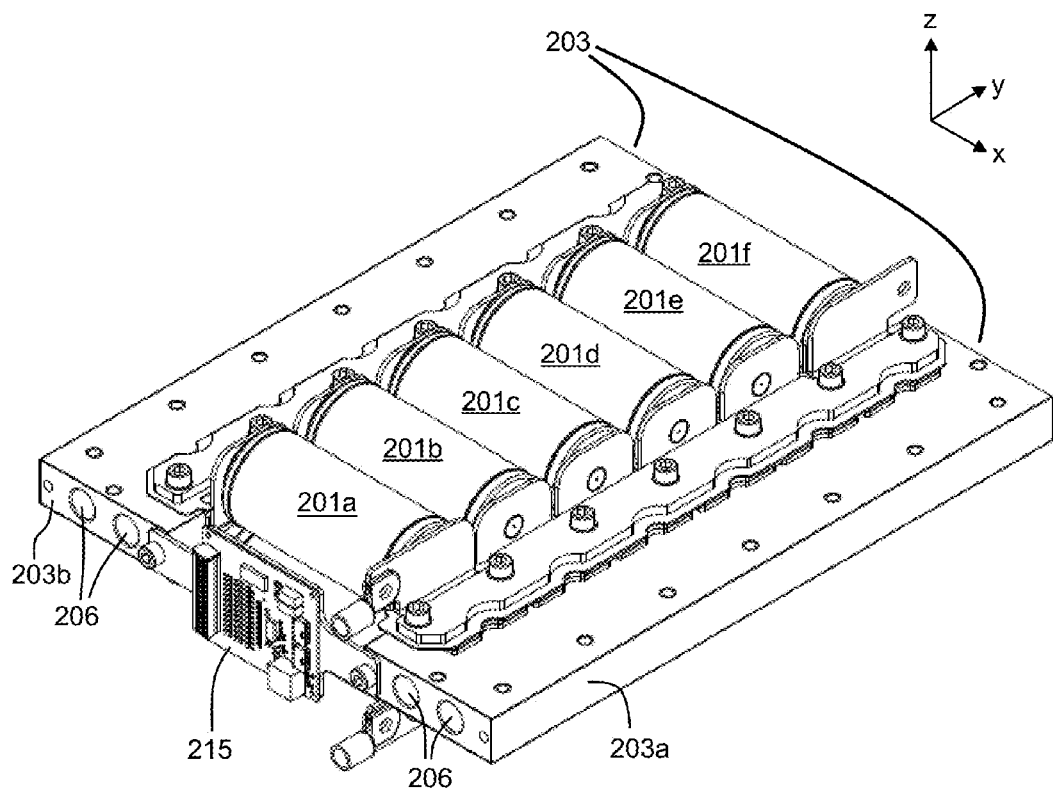
FIGS. 2a, 2b and 2c illustrate a capacitor module according to an exemplifying and non-limiting embodiment of the invention.
Figure 2B:
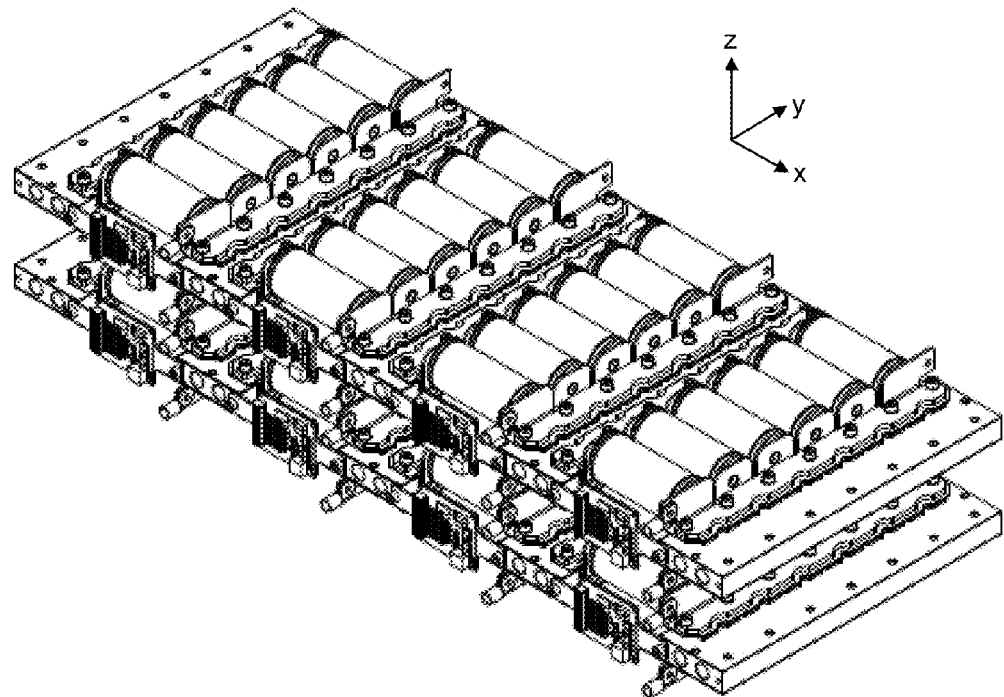
Figure 2C:
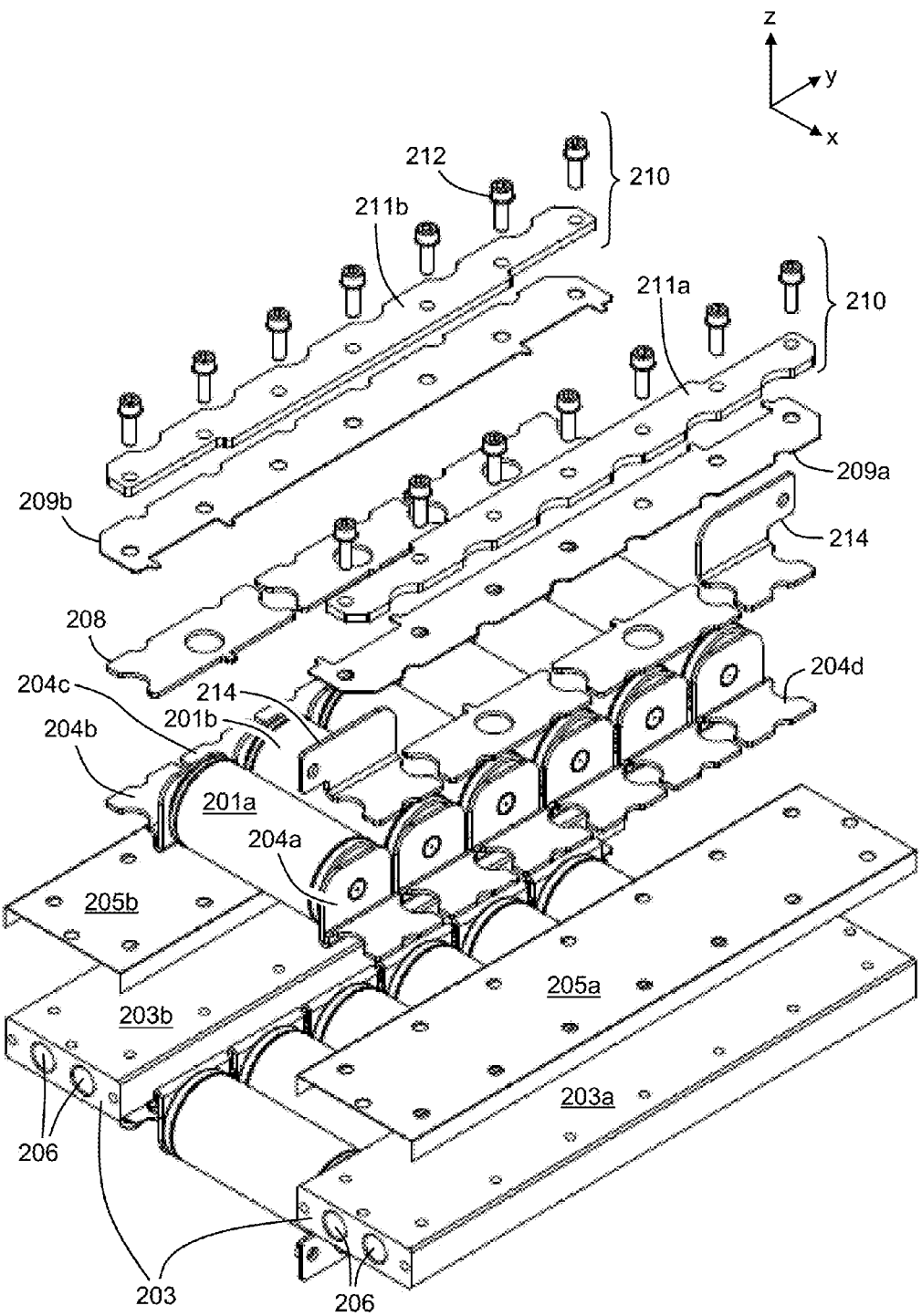

FIG. 2a shows an isometric view of a capacitor module according to an exemplifying and non-limiting embodiment of the invention. FIG. 2b illustrates how capacitor modules of the kind shown in FIG. 2a can be interconnected to constitute a larger entity. FIG. 2c shows an exploded view of the capacitor module shown in FIG. 2a.

As illustrated in FIG. 2c, the capacitor module comprises twelve capacitor elements. Six of the capacitor modules are denoted with reference numbers 201a, 201b, 201c, 201d, 201e, and 201f in FIG. 2a. The capacitor modules are mechanically connected to a cooling structure 203 which comprises a first heat-sink element 203a and a second heat-sink element 203b. The first and second heat-sink elements comprise cooling channels 206 for conducting cooling fluid, e.g. water. The capacitor module comprises flexible connection elements four of which are denoted with reference numbers 204a, 204b, 204c, and 204d in FIG. 2c. The electrical terminals of the capacitor elements are mechanically connected to the cooling structure via the flexible connection elements so that first ends of the flexible connection elements are attached to the electrical terminals, e.g. by welding or soldering, and second ends of the flexible connection elements are pressed against electrically insulating membranes 205a and 205b on the surfaces of the first and second heat-sink elements 203a and 203b as can be understood from the exploded view shown in FIG. 2c. The electrically insulating membranes 205a and 205b can be for example Sil-Pad® 400, Sil-Pad® K-10, or Gap Pad® 1450 produced by the Bergquist Company, or some other suitable material or composite which provides a sufficiently good thermal conductivity and a sufficiently good barrier against dielectric breakthrough.

The capacitor module illustrated in FIGS. 2a and 2c further comprises connection plates made of electrically conductive material and arranged to provide galvanic connections between the capacitor elements so that the second ends of the flexible connection elements are pressed between the connection plates and the membranes of electrically insulating material. In FIG. 2c, one of the connection plates is denoted with a reference number 208. As can be understood from FIG. 2c, the second ends of the flexible connection elements 204b and 204c are pressed between the electrically insulating membrane 205b and the connection plate 208. Thereby there is a galvanic connection between the electrical terminals attached to the flexible connection elements 204b and 204c. As can be understood from FIG. 2c, the connection plates are arranged to connect the capacitor elements denoted with the reference numbers 201a-201f in FIG. 2a in series so that the flexible connection elements 204a and 204d constitute the output poles of the series connection. In order to enable electrical connections to an external system, the capacitor module comprises terminal elements 214 one of which is arranged to have a galvanic contact with the flexible connection element 204a and the other of which is arranged to have a galvanic contact with the flexible connection element 204d.

It is worth noting that, depending on the electrical connection of the capacitor elements, it is also possible that two or more electrical terminals of the capacitor modules are mechanically connected to the cooling structure with the aid of a same flexible connection element. For example, in the exemplifying case illustrated in FIGS. 2a and 2c, the flexible connection elements 204b and 204c could be replaced with such a single connection element whose first end connected to the electrical terminals of the capacitor modules 201a and 201b is two-branched so as to allow these electrical terminals to move with respect to the heat-sink element 203b independently of each other. Thus, the need for the connection plates, such as the connection plate 208, can be avoided by using suitable flexible connection elements. On the other hand, there can be factors which are related to for example manufacturing and production management and in light of these factors it may be advantageous that each of the electrical terminals of the capacitor elements is attached to its own flexible connection element and all the flexible connection elements are mutually similar.

The capacitor module illustrated in FIGS. 2a and 2c further comprises insulator plates 209a and 209b each comprising electrically insulating material. The capacitor module comprises pressing devices 210 for pressing the insulator plates towards the cooling structure. As can be understood from FIG. 2c, for example the connection plate 208 is pressed between the insulator plate 209b and the second ends of the flexible connection elements 204b and 204c. The pressing devices 210 comprise press-plates 211a and 211b and bolts for pressing the press-plates so that the sandwich structures constituted by the insulator plates 209a and 209b, the connection plates and the terminal elements 214, the second ends of the flexible connection elements, and the electrically insulating membranes 205a and 205b are pressed between the press-plates 211a and 211b and the heat-sink elements 203a and 203b. In FIG. 2c, one of the bolts is denoted with a reference number 212. In order to avoid unwanted galvanic contacts, the connection plates, the terminal elements 214, and the second ends of the flexible connection elements are shaped so that they do not touch the bolts.

The insulator plates 209a and 209b comprise advantageously electrical conductors arranged to form galvanic contacts with the connection plates and to carry electrical signals indicative of voltages of the capacitor elements. The insulator plates 209a and 209b can be e.g. printed circuit boards "PCB" provided with connection pads for making the desired galvanic contacts with the appropriate connection plates. The electrical signals indicative of the voltages of the capacitor elements can be connected with appropriate wirings to an electronic system 215 shown in FIG. 2a. The electronic system 215 may comprise means for monitoring and controlling for example that the total voltage of the capacitor module is distributed sufficiently evenly between the series connected capacitor elements and that the voltage of each capacitor element is below a safety limit. It is also possible that the electronic system 215 is provided with means for transmitting data indicative of the voltages of the capacitor elements to an external control system.

Figure 3:
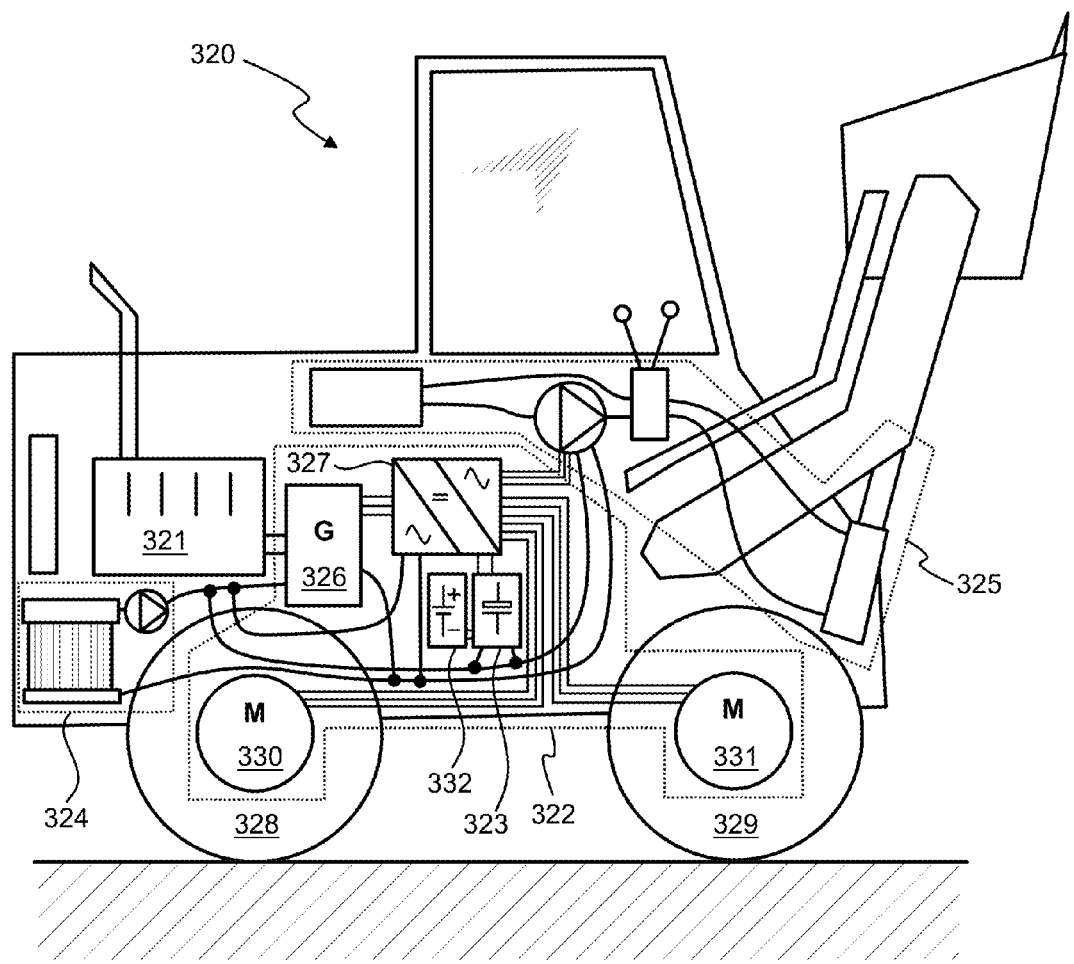
FIG. 3 shows a schematic illustration of a mobile working machine according to an exemplifying and non-limiting embodiment of the invention.

FIG. 3 shows a schematic illustration of a mobile working machine 320 according to an exemplifying and non-limiting embodiment of the invention. In this exemplifying case, the mobile working machine is a bucket charger but the mobile working machine could as well be a tractor, a road drag, a bulldozer, or any other working machine having wheels and/or chain tracks or any other means for moving. The mobile working machine comprises a combustion engine 321 that can be e.g. a diesel engine, an Otto-cycle engine, or a turbine engine. The mobile working machine comprises an electromechanical power transmission chain 322 between the combustion engine 321 and wheels of the mobile working machine. In FIG. 3, two of the wheels are denoted with reference numbers 328 and 329. The electro-mechanical transmission chain comprises a generator 326 the rotor of which is mechanically connected to the shaft of the combustion engine. The electromechanical transmission chain comprises an electronic power converter 327 and electrical motors at the hubs of the wheels of the mobile working machine. In FIG. 3, two of the electrical motors are denoted with reference numbers 330 and 331. The electronic power converter 327 is arranged to convert the electrical voltage produced by the generator 326 into electrical voltages having amplitudes and frequencies suitable for the electrical motors. The electromechanical transmission chain further comprises a capacitive energy-storage 323 comprising one or more capacitor modules. Each of the capacitor modules comprises one or more capacitor elements and a cooling structure for cooling the one or more capacitor elements. The electrical terminals of each capacitor element are mechanically connected to the cooling structure so that at least one of the electrical terminals of each capacitor element is mechanically connected to the cooling structure via a flexible connection element so as to allow the corresponding electrical terminal to move with respect to the cooling structure when the distance between the electrical terminals varies due to changes in load and/or temperature and/or due to ageing of the capacitor element under consideration.

A mobile working machine according to an exemplifying and non-limiting embodiment of the invention comprises a liquid cooling system 324, and the cooling structure of each capacitor module comprises cooling ducts connected to the liquid cooling system 324. The liquid cooling system 324 can be arranged to cool also the other parts of the electromechanical power transmission chain 322, and/or a hydraulic system 325 of the mobile working machine, and/or the combustion engine 321.

A mobile working machine according to an exemplifying and non-limiting embodiment of the invention comprises a battery element 332 which, together with the capacitive energy-storage 323, can be used for responding to peak power needs exceeding the maximum power of the combustion engine 321.

The specific examples provided in the description given above should not be construed as limiting the applicability and/or interpretation of the appended claims.

What is claimed is:

1. A capacitor module comprising:
    capacitor elements each comprising electrical terminals,
    a cooling structure for cooling the capacitor elements, the electrical terminals of the capacitor elements being mechanically connected to the cooling structure to be in heat-conductive relations with the cooling structure,
    flexible connection elements made of electrically conductive material, at least one of the electrical terminals of each of the capacitor elements being mechanically connected to the cooling structure via one of the flexible connection elements so as to allow the electrical terminal under consideration to move with respect to the cooling structure,
    an electrically insulating membrane between the cooling structure and one or more of the flexible connection elements,
    one or more connection plates made of electrically conductive material and arranged to provide galvanic connections between the capacitor elements so that one ends of the flexible connection elements are pressed between the connection plates and the electrically insulating membrane, and
    one or more insulator plates comprising electrically insulating material, and pressing devices for pressing the insulator plates towards the cooling structure so that the connection plates are pressed between the insulator plates and the ends of the flexible connection elements.

2. A capacitor module according to claim 1, wherein each of the flexible connection elements is a sheet of the electrically conductive material, a first end of each of the flexible connection elements having a galvanic contact with the corresponding electrical terminal, a second end of each of the flexible connection elements being mechanically connected to the cooling structure, and a middle portion of each of the flexible connection elements being arranged to bend in response to a situation in which the corresponding electrical terminal moves with respect to the cooling structure.

3. A capacitor module according to claim 1, wherein the one or more insulator plates comprise electrical conductors arranged to form galvanic contacts with the connection plates and to carry electrical signals indicative of voltages of the capacitor elements.

4. A capacitor module according to claim 1, wherein the cooling structure comprises:
    a first heat-sink element mechanically connected to first ones of the electrical terminals of the capacitor elements with first ones of the flexible connection elements, and
    a second heat-sink element mechanically connected to second ones of the electrical terminals of the capacitor elements with second ones of the flexible connection elements.

5. A capacitor module according to claim 1, wherein the cooling structure comprises at least one of the following: cooling channels for conducting cooling fluid, cooling fins for conducting heat to ambient air.

6. A capacitor module according to claim 1, wherein each of the capacitor elements is an electric double-layer capacitor.

7. A capacitor module according to claim 2, wherein the one or more insulator plates comprise electrical conductors arranged to form galvanic contacts with the connection plates and to carry electrical signals indicative of voltages of the capacitor elements.

8. A capacitor module according to claim 2, wherein the cooling structure comprises:
    a first heat-sink element mechanically connected to first ones of the electrical terminals of the capacitor elements with first ones of the flexible connection elements, and
    a second heat-sink element mechanically connected to second ones of the electrical terminals of the capacitor elements with second ones of the flexible connection elements.

9. A capacitor module according to claim 2, wherein the cooling structure comprises at least one of the following: cooling channels for conducting cooling fluid, cooling fins for conducting heat to ambient air.

10. A capacitor module according to claim 2, wherein each of the capacitor elements is an electric double-layer capacitor.

11. A capacitor module according to claim 3, wherein the cooling structure comprises:
    a first heat-sink element mechanically connected to first ones of the electrical terminals of the capacitor elements with first ones of the flexible connection elements, and
    a second heat-sink element mechanically connected to second ones of the electrical terminals of the capacitor elements with second ones of the flexible connection elements.

12. A capacitor module according to claim 3, wherein the cooling structure comprises at least one of the following: cooling channels for conducting cooling fluid, cooling fins for conducting heat to ambient air.

13. A capacitor module according to claim 3, wherein each of the capacitor elements is an electric double-layer capacitor.

14. A capacitor module according to claim 4, wherein the cooling structure comprises at least one of the following: cooling channels for conducting cooling fluid, cooling fins for conducting heat to ambient air.

15. A capacitor module according to claim 4, wherein each of the capacitor elements is an electric double-layer capacitor.

16. A capacitor module according to claim 5, wherein each of the capacitor elements is an electric double-layer capacitor.

17. A mobile working machine comprising:
a combustion engine, and
an electromechanical power transmission chain between the combustion engine and one or more actuators of the mobile working machine,
wherein the electromechanical power transmission chain comprises a capacitive energy-storage comprising at least one capacitor module that comprises:
capacitor elements each comprising electrical terminals,
a cooling structure for cooling the capacitor elements, the electrical terminals of the capacitor elements being mechanically connected to the cooling structure to be in heat-conductive relations with the cooling structure,
flexible connection elements made of electrically conductive material, at least one of the electrical terminals of each of the capacitor elements being mechanically connected to the cooling structure via one of the flexible connection elements so as to allow the electrical terminal under consideration to move with respect to the cooling structure,
an electrically insulating membrane between the cooling structure and one or more of the flexible connection elements,
one or more connection plates made of electrically conductive material and arranged to provide galvanic connections between the capacitor elements so that one ends of the flexible connection elements are pressed between the connection plates and the electrically insulating membrane, and
one or more insulator plates comprising electrically insulating material, and pressing devices for pressing the insulator plates towards the cooling structure so that the connection plates are pressed between the insulator plates and the ends of the flexible connection elements.

18. A mobile working machine according to claim 17, wherein the cooling structure of the capacitor module comprises cooling channels for conducting cooling fluid and the mobile working machine comprises a liquid cooling system connected to the cooling channels of the capacitor module.

19. A mobile working machine according to claim 18, wherein the liquid cooling system is configured to cool a hydraulic system of the mobile working machine.

\* \* \* \* \*